(12) United States Patent
Derderian et al.

(10) Patent No.: US 7,122,422 B2
(45) Date of Patent: Oct. 17, 2006

(54) METHODS OF FORMING CAPACITORS

(75) Inventors: Garo J. Derderian, Boise, ID (US); Kevin R. Shea, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 10/895,481

(22) Filed: Jul. 20, 2004

(65) Prior Publication Data

US 2006/0019461 A1  Jan. 26, 2006

(51) Int. Cl.
*H01L 21/8242* (2006.01)

(52) U.S. Cl. .................. 438/240; 438/253; 438/381; 438/393

(58) Field of Classification Search ............... 438/3, 438/238–240, 250–256, 381, 390–399
See application file for complete search history.

(56) References Cited

U.S. PATENT DOCUMENTS

| | | |
|---|---|---|
| 6,458,416 B1 | 10/2002 | Derderian et al. |
| 6,627,260 B1 | 9/2003 | Derderian et al. |
| 6,780,766 B1 | 8/2004 | Basceri et al. |
| 6,900,106 B1 | 5/2005 | Basceri et al. |
| 6,967,154 B1 | 11/2005 | Meng et al. |
| 2003/0096473 A1 * | 5/2003 | Shih et al. .................. 438/240 |
| 2003/0168689 A1 | 9/2003 | Basceri et al. |
| 2003/0213987 A1 | 11/2003 | Basceri et al. |
| 2003/0222300 A1 | 12/2003 | Basceri et al. |
| 2004/0180555 A1 | 9/2004 | Basceri et al. |

OTHER PUBLICATIONS

Material Safety Data Sheet: *BakerClean® JTB-111 FEOL Cleaner*, Mallinckrodt Baker, Inc., MSDS No. B0034, 5 pages (Jun. 29, 2001).

* cited by examiner

*Primary Examiner*—H. Jey Tsai
(74) *Attorney, Agent, or Firm*—Wells St. John P.S.

(57) ABSTRACT

This invention includes methods of forming capacitors. In one implementation, a first capacitor electrode material is formed over a substrate. The first capacitor electrode material is exposed to a nitrogen comprising atmosphere effective to form a dielectric silicon and nitrogen comprising material on the first capacitor electrode material. The dielectric silicon and nitrogen comprising material is exposed to an aqueous fluid comprising a base and an oxidizer. The aqueous fluid has a pH greater than 7.0. After the exposing to the aqueous fluid, an aluminum oxide comprising capacitor dielectric material is deposited over the first capacitor electrode material. A second capacitor electrode material is formed over the aluminum oxide comprising capacitor dielectric material. Other aspects and implementations are contemplated.

78 Claims, 2 Drawing Sheets

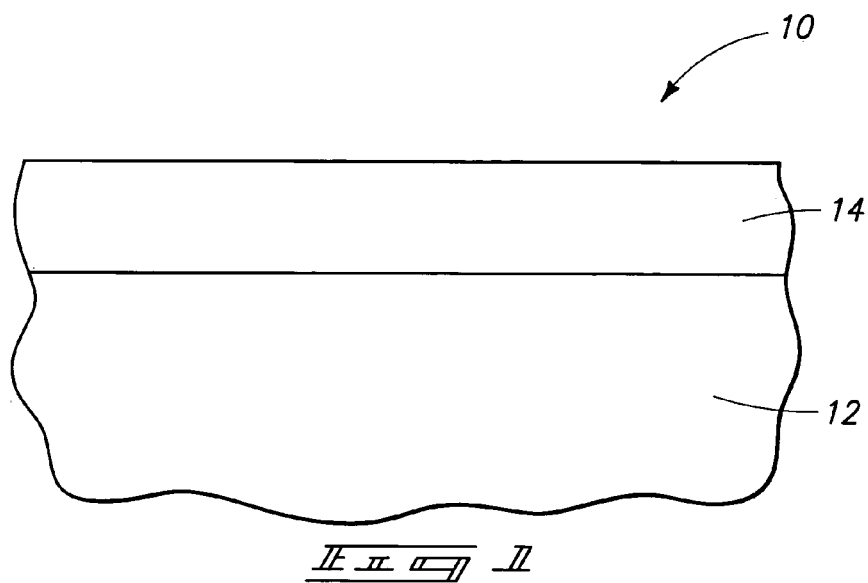
_Fig. 1_
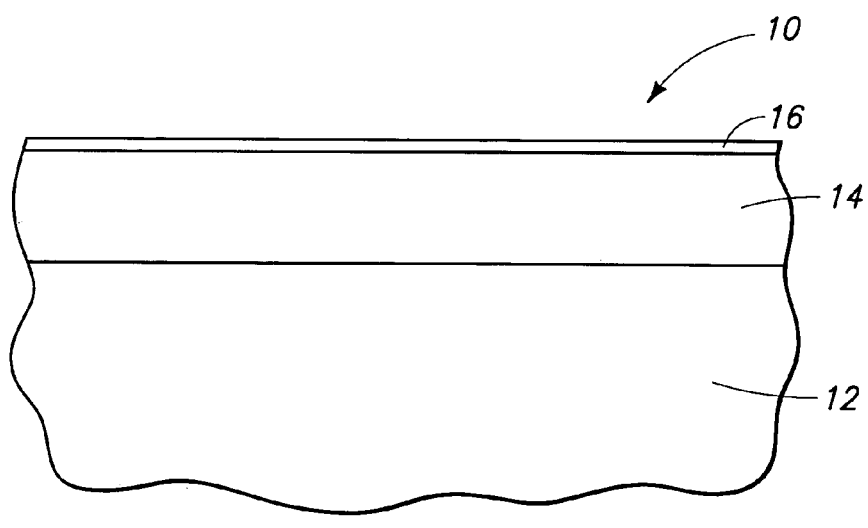
_Fig. 2_
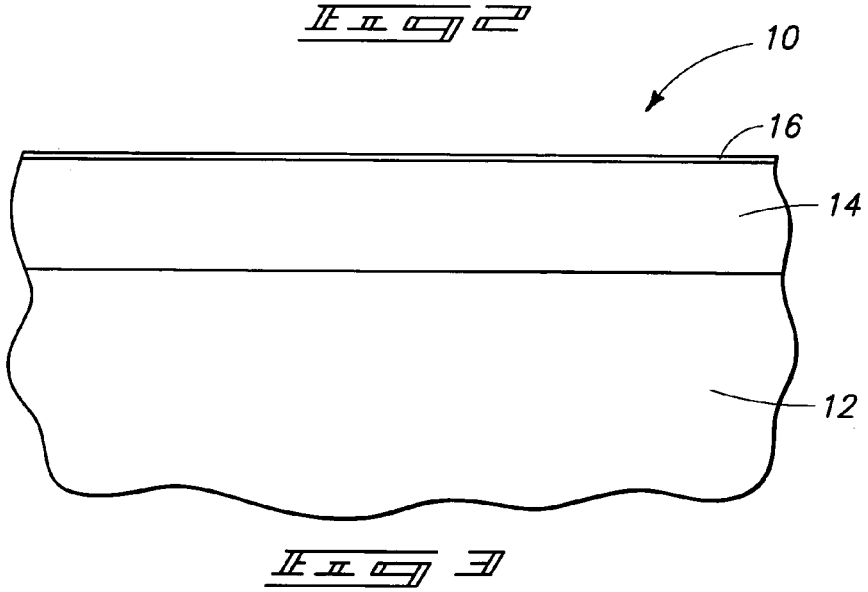
_Fig. 3_

METHODS OF FORMING CAPACITORS

TECHNICAL FIELD

This invention relates to methods of forming capacitors.

BACKGROUND OF THE INVENTION

Capacitors are one type of device used in integrated circuits, for example in the fabrication of logic circuitry and memory circuitry. A continuing goal in integrated circuit manufacture is to reduce the size of individual devices, thereby increasing density and/or reducing the size of the integrated circuit which is manufactured. With capacitors, a continuing challenge is presented to produce ever smaller capacitors, while maintaining desired adequate capacitance. Techniques for doing so include improved structural design as well as utilizing materials which maximize capacitance. For example, high dielectric constant capacitor dielectric materials have been introduced to replace or complement conventional dielectric materials such as silicon nitride. Further, treatment of capacitor electrodes, as well as treatment of capacitor dielectric materials after deposition, can favorably or adversely affect the ultimate capacitance of the capacitor.

Often, there is a trade-off between desired capacitance and undesired leakage current through the capacitor. In many instances, techniques and materials which maximize dielectric constant can also increase leakage current between the capacitor electrodes in varying degrees. It would be desirable to develop techniques which tend to increase dielectric constants of certain deposited material, and thereby capacitance of the capacitor, without a corresponding large degree of increase in leakage current.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention includes methods of forming capacitors. In one implementation, a first capacitor electrode material is formed over a substrate. The first capacitor electrode material is exposed to a nitrogen comprising atmosphere effective to form a dielectric silicon and nitrogen comprising material on the first capacitor electrode material. The dielectric silicon and nitrogen comprising material is exposed to an aqueous fluid comprising a base and an oxidizer. The aqueous fluid has a pH greater than 7.0. After the exposing to the aqueous fluid, an aluminum oxide comprising capacitor dielectric material is deposited over the first capacitor electrode material. A second capacitor electrode material is formed over the aluminum oxide comprising capacitor dielectric material.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a substrate fragment in process in accordance with an aspect of the invention.

FIG. 2 is a is a view of the FIG. 1 substrate fragment at a processing step subsequent to that depicted by FIG. 1.

FIG. 3 is a is a view of the FIG. 2 substrate fragment at a processing step subsequent to that depicted by FIG. 2.

DETAILED DESCRIPTION OF THE PREFERRED EMBODIMENTS

Figure 4:
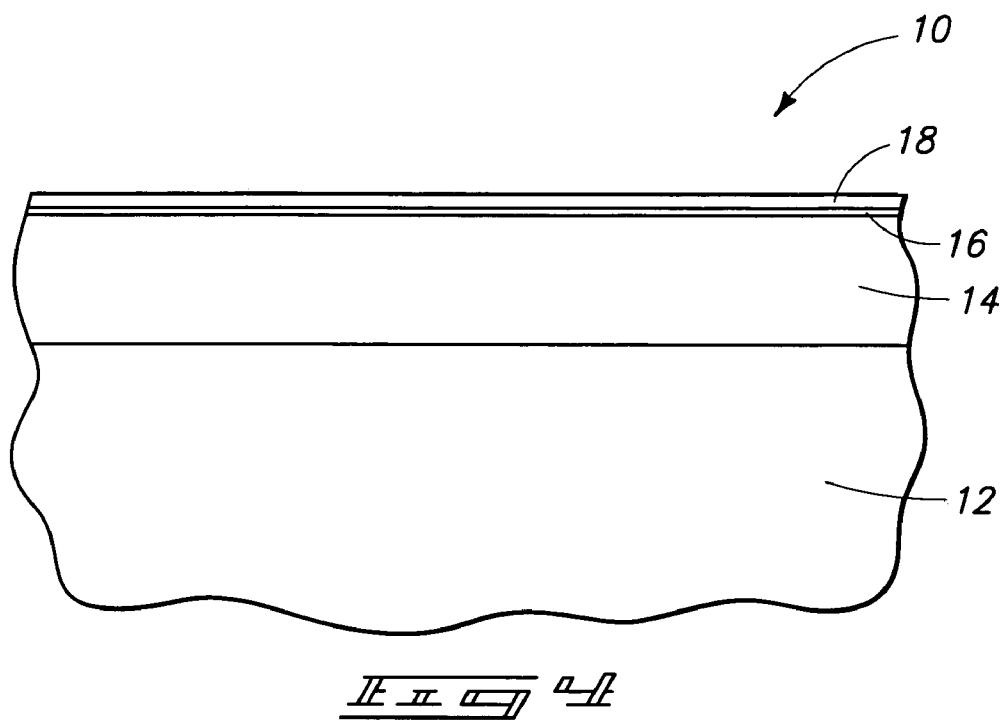
FIG. 4 is a is a view of the FIG. 3 substrate fragment at a processing step subsequent to that depicted by FIG. 3.

This disclosure of the invention is submitted in furtherance of the constitutional purposes of the U.S. Patent Laws "to promote the progress of science and useful arts" (Article 1, Section 8).

Preferred embodiments of methods of forming a capacitor in accordance with aspects of the invention are described with reference with FIGS. 1–5. Aspects of the invention were motivated from capacitor fabrication methods as disclosed in an application entitled "MIS Capacitor And Method Of Formation" filed on May 16, 2002, listing inventors as Cem Basceri and Garo J. Derderian, having Ser. No. 10/145,993, and which is now U.S. Patent Application Publication No. U.S. 2003/0213987 A1, published on Nov. 20, 2003. This Ser. No. 10/145,993 application is hereby fully incorporated by reference as if presented in its entirety herein. Accordingly, preferred attributes of fabricating capacitors herein are in accordance with the Ser. No. 10/145,993 disclosure and as additionally described herein. An aspect which motivated the invention was to achieve improved capacitance without a significant adverse increase in leakage current in MIS capacitors of metal-aluminum oxide-polysilicon materials where silicon oxynitride material is formed during the method and likely constitutes part of the capacitor dielectric material in the finished capacitor construction. Apparently, silicon nitride and/or silicon oxynitride present over a lower polysilicon electrode can reduce undesired silicon dioxide formation which otherwise undesirably occurs during deposition of an aluminum oxide layer over a polysilicon comprising electrode material. While the invention was principally motivated from this perspective, the invention is in no way so limited. Rather, the invention is limited only by the accompanying claims as literally worded without interpretative reference to this specification, and in accordance with the doctrine of equivalents.

Referring to FIG. 1, a substrate fragment, preferably a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Fragment 10 comprises a substrate 12, typically and preferably some semiconductor substrate. By way of example only, a preferred substrate is that of FIG. 5 of U.S. patent application Ser. No. 10/145,993 incorporated by reference above. A first capacitor electrode material 14 is formed over substrate 12. A preferred material is silicon, such as conductively doped polysilicon (for example HSG polysilicon), although any conductive material is contemplated, whether existing or yet-to-be developed. Substrate 12 would typically comprise some conductive substrate node location in electrical connection with material 14. Alternately or in addition thereto, subsequent electrical connection might be made to conductive material 14 for accessing the first capacitor electrode material in the finished circuitry construction. First capacitor electrode material 14 might, of course, comprise multiple different conductive materials, either homogenously distributed, in layers, or otherwise. Further, an exemplary preferred first capacitor electrode is fabricated in accordance with the FIG. 11 structure of the incorporated U.S. patent application Ser. No. 10/145,993.

In one preferred implementation, first capacitor electrode material 14 is exposed to an acidic fluorine containing solution, for example to clean most if not all of any native oxide which might form on material 14. By way of example, an exemplary fluorine clean utilizes a fluid comprising $NF_4$, $H_3PO_4$, and water at room temperature and room pressure in a bath for approximately 40 seconds. In one preferred embodiment, first capacitor electrode material 14 is annealed with $PH_3$, for example preferably to increase or enhance n-type conductivity doping at the surface of material 14. By way of example only, a preferred phosphine anneal is at subatmospheric pressure, at from 600° C.–800° C. for from one minute to four minutes.

Referring to FIG. 2 herein, first capacitor electrode material 14 has been exposed to a nitrogen comprising atmosphere effective to form a dielectric silicon and nitrogen comprising material 16 on first capacitor electrode material 14. Preferred atmospheres include $NH_3$, and $N_2$ and $H_2$, and with or without plasma. Most preferred is a nitrogen comprising atmosphere at least the majority of which comprises $NH_3$. Other example preferred nitrogen comprising/nitridizing ambients are otherwise as described in the incorporated U.S. patent application Ser. No. 10/145,993. In one preferred embodiment, dielectric silicon and nitrogen comprising material 16 comprises $Si_3N_4$. However more typically, dielectric silicon and nitrogen comprising material 16 will comprise a silicon oxynitride $Si_xO_yN_z$ material. Such typically results from unpreventable exposure to oxygen subsequent to the exposure to the nitrogen comprising atmosphere. In one preferred embodiment, the silicon in the $Si_xO_yN_z$ is formed from the polysilicon of first capacitor electrode material 14. An exemplary thickness range for material 16 is from 5 Angstroms to 60 Angstroms.

Referring to FIG. 3, dielectric silicon and nitrogen comprising material 16 has been exposed to an aqueous fluid comprising a base and an oxidizer (the oxidizer being something in addition to the inherent $H_2O$), with the aqueous fluid having a pH greater than 7.0. In one preferred implementation, the exposing to the aqueous fluid etches at least some of the silicon and nitrogen comprising material from the substrate, and in one implementation etches only some of the silicon and nitrogen comprising material from the substrate. However, aspects of the invention also contemplate etching none or etching all of the silicon and nitrogen comprising material from the substrate. In one preferred implementation, the aqueous fluid has a pH of at least 9.0, and in another preferred implementation has a pH of at least 11.0. Preferred bases comprise $NH_4OH$, KOH and $Al(OH)_3$. Further by way of example only in one embodiment, the base might comprise an alkyl ammonium hydroxide, for example $(CH_3)_4NOH$. In another exemplary preferred embodiment however, the aqueous solution is void of any alkyl ammonium hydroxide.

Exemplary preferred oxidizers include $H_2O_2$, $O_3$ and ammonium persulfate whether alone or in combinations. One preferred aqueous fluid comprises $NH_4OH$ present in the aqueous fluid at no greater than about 1.0% by weight and $H_2O_2$ present in the aqueous fluid at no great than about 2.0% by weight. More preferably, such fluid preferably has $NH_4OH$ present at from about 0.45% by weight to about 0.55% by weight, with $H_2O_2$ being present at from about 0.5% by weight to about 1.5% by weight. In one preferred implementation, the aqueous fluid consists essentially of water, $NH_4OH$, and $H_2O_2$, and has a pH of at least 10.0.

By way of example only, a preferred exposure to an aqueous fluid occurs in a bath or by a spray rinse, and with a fluid temperature of from about 35° C. to about 70° C. at ambient room pressure. In one preferred embodiment, the exposing to the aqueous fluid is for from no greater than 15 minutes, and in another preferred embodiment is for no greater than 3 minutes.

Referring to FIG. 4, after the exposing to the aqueous fluid, an aluminum oxide comprising capacitor dielectric material 18 is deposited over first capacitor electrode material 14. In the depicted exemplary and preferred embodiment where at least some of dielectric silicon and nitrogen comprising material 16 remains, aluminum oxide comprising capacitor dielectric material 18 is deposited on silicon and nitrogen comprising material 16 (meaning in at least some direct contact therewith). An exemplary preferred thickness range for aluminum oxide comprising dielectric material 16 is from 10 Angstroms to 90 Angstroms. Material 16 might comprise material in addition to aluminum oxide, for example and by way of example only, other metal oxides, whether homogeneously distributed therein, discretely distributed therein, and/or comprised of discrete layers. By way of example only, preferred techniques for depositing an aluminum oxide comprising material include chemical vapor deposition and atomic layer deposition, by way of example only as disclosed in the referenced U.S. patent application Ser. No. 10/145,993. In one exemplary preferred embodiment, aluminum oxide comprising capacitor dielectric material 18 comprises a combination of aluminum oxide and hafnium oxide, for example designated as $Al_xHf_yO_z$. Yet in another exemplary preferred embodiment, all capacitor dielectric material received intermediate first capacitor electrode material 14 and second capacitor electrode material 20 is void of hafnium oxide.

Figure 5:
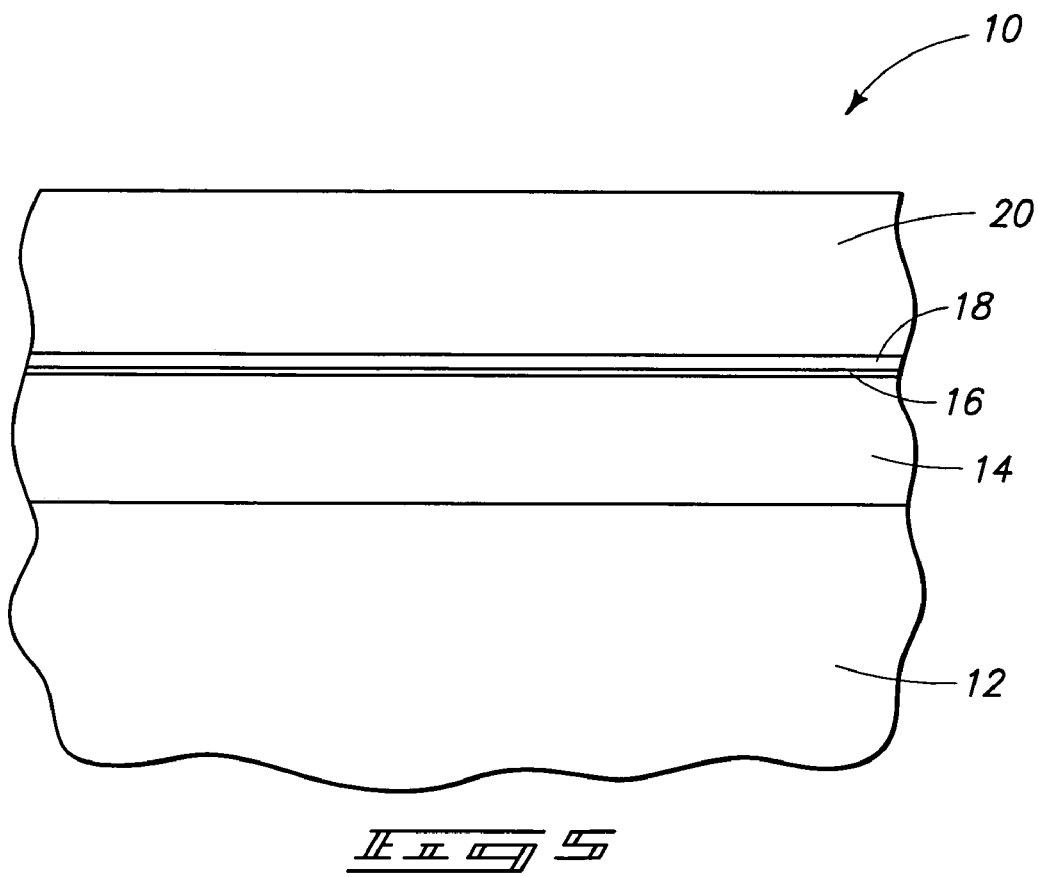
FIG. 5 is a is a view of the FIG. 4 substrate fragment at a processing step subsequent to that depicted by FIG. 4.

Referring to FIG. 5, second capacitor electrode material 20 is formed over aluminum oxide comprising dielectric material 18, and preferably thereon as shown. Second capacitor electrode material 20 might be the same as or different from first capacitor electrode material 14. In one preferred embodiment, first capacitor electrode material 14 comprises conductively doped semiconductive material, and second capacitor electrode material 20 is metal comprising, with metal comprising meaning including an elemental form metal, an alloy of elemental metals, and/or being a metal compound, thereby forming an MIS capacitor. By way of example only, one exemplary preferred material is TiN.

In one preferred implementation, the exposing to the aqueous fluid is effective to increase capacitance of the capacitor formed by the method than would otherwise occur under identical conditions but for the exposing to the aqueous fluid. For example, and by way of example only, capacitance of a TiN—$Al_2O_3$—$Si_xO_yN_z$-polysilicon capacitor achieved increased capacitance by greater than 1 femtofarad per capacitor with only a 0.3 femtoamp per capacitor increase in current leakage as compared to capacitors otherwise identically processed but for the aqueous fluid exposure. In such reduction-to-practice example, the thickness of the $Si_xO_yN_z$ was 12 Angstroms and the thickness of the aluminum oxide comprising layer was about 40 Angstroms, with the aqueous fluid being at room pressure and at 55° C. for about 3 minutes. The increased capacitance might be due to etching which might be occurring of the silicon oxynitride, and/or some other treatment/passivating effect, for example and by way of example only, the removing of fluorine which may be present at the surface of the silicon oxynitride.

In one preferred implementation, the method is void of any exposure of the substrate to an aqueous fluid having a pH less than 7.0 intermediate the above exposing of the substrate to an aqueous fluid having a pH of greater than 7.0 and the depositing of the aluminum oxide comprising capacitor dielectric material.

The prior art is understood to have treated a layer consisting of hafnium oxide with a proprietary material disclosed as containing 89% to 99% water, less than 5% alkyl ammonium hydroxide, and two other proprietary components. The prior art is otherwise not understood to teach or suggest the processing as described above and claimed herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a capacitor, comprising:
   forming a first capacitor electrode material over a substrate;
   exposing the first capacitor electrode material to a nitrogen-comprising atmosphere effective to form a dielectric silicon and nitrogen-comprising material on the first capacitor electrode material;
   exposing the dielectric silicon and nitrogen-comprising material to an aqueous fluid comprising a base and an oxidizer, the aqueous fluid having a pH greater than 7.0;
   after the exposing to the aqueous fluid, depositing an aluminum oxide-comprising capacitor dielectric material over the first capacitor electrode material; and
   forming a second capacitor electrode material over the aluminum oxide-comprising capacitor dielectric material.

2. The method of claim 1 wherein the first capacitor electrode material comprises silicon.

3. The method of claim 1 wherein the first capacitor electrode material comprises conductively doped polysilicon.

4. The method of claim 1 wherein the nitrogen-comprising atmosphere comprises $NH_3$.

5. The method of claim 4 wherein at least a majority of the nitrogen-comprising atmosphere is $NH_3$.

6. The method of claim 1 wherein the nitrogen-comprising atmosphere comprises $N_2$ and $H_2$.

7. The method of claim 1 wherein the nitrogen-comprising atmosphere comprises $N_2$ and $H_2$ plasma.

8. The method of claim 1 wherein the dielectric silicon and nitrogen-comprising material comprises $Si_xO_yN_z$.

9. The method of claim 1 wherein the dielectric silicon and nitrogen-comprising material comprises $Si_3N_4$.

10. The method of claim 1 wherein the base comprises $NH_4OH$.

11. The method of claim 10 wherein $NH_4OH$ is present in the aqueous fluid at no greater than about 1.0% by weight.

12. The method of claim 10 wherein the base consists essentially of $NH_4OH$.

13. The method of claim 1 wherein the base comprises $(CH_3)_4NOH$.

14. The method of claim 1 wherein the base comprises an alkyl ammonium hydroxide.

15. The method of claim 1 wherein the aqueous solution is void of any alkyl ammonium hydroxide.

16. The method of claim 1 wherein the base comprises KOH.

17. The method of claim 1 wherein the base comprises $Al(OH)_3$.

18. The method of claim 1 wherein the base comprises $NH_4OH$ and the aqueous solution is void of any alkyl ammonium hydroxide.

19. The method of claim 18 wherein the base consists essentially of $NH_4OH$.

20. The method of claim 1 wherein the aqueous fluid has a pH of at least 9.0.

21. The method of claim 1 wherein the aqueous fluid has a pH of at least 11.0.

22. The method of claim 1 wherein the oxidizer comprises $H_2O_2$.

23. The method of claim 1 wherein the oxidizer comprises $O_3$.

24. The method of claim 1 wherein the oxidizer comprises ammonium persulfate.

25. The method of claim 1 wherein the oxidizer comprises at least two of $H_2O_2$, $O_3$, and ammonium persulfate.

26. The method of claim 1 wherein the base comprises $NH_4OH$ and the oxidizer comprises $H_2O_2$.

27. The method of claim 26 wherein $NH_4OH$ is present in the aqueous fluid at no greater than about 1.0% by weight, and $H_2O_2$ is present in the aqueous fluid at no greater than about 2.0% by weight.

28. The method of claim 26 wherein $NH_4OH$ is present in the aqueous fluid at from about 0.45% by weight to about 0.55% by weight, and $H_2O_2$ is present in the aqueous fluid at from about 0.5% by weight to about 1.5% by weight.

29. The method of claim 28 wherein the aqueous fluid consists essentially of water, $NH_4OH$, and $H_2O_2$, and has a pH of at least 10.0.

30. The method of claim 1 wherein the exposing to the aqueous fluid etches at least some of the silicon and nitrogen-comprising material from the substrate.

31. The method of claim 30 wherein the exposing to the aqueous fluid etches only some of the silicon and nitrogen-comprising material from the substrate.

32. The method of claim 1 wherein the aluminum oxide-comprising dielectric is deposited on the silicon and nitrogen-comprising material.

33. The method of claim 32 wherein the exposing to the aqueous fluid etches some, and only some, of the silicon and nitrogen-comprising material from the substrate.

34. The method of claim 1 wherein the aluminum oxide-comprising capacitor dielectric material also comprises hafnium oxide.

35. The method of claim 1 wherein all capacitor dielectric material received intermediate the first capacitor electrode material and the second capacitor electrode material is void of hafnium oxide.

36. The method of claim 1 comprising annealing the first capacitor electrode material with $PH_3$ prior to the exposing to the nitrogen-comprising atmosphere.

37. The method of claim 1 comprising exposing the first capacitor electrode material to an acidic fluorine-containing solution prior to the exposing to the nitrogen-comprising atmosphere.

38. The method of claim 1 wherein the exposing to the aqueous fluid is effective to increase capacitance of the capacitor formed by the method than would otherwise occur under identical conditions but for the exposing to the aqueous fluid.

39. The method of claim 1 wherein the exposing to the aqueous fluid is for no greater than 15 minutes.

40. The method of claim 1 wherein the exposing to the aqueous fluid is for no greater than 3 minutes.

41. The method of claim 1 being void of any exposure of the substrate to an aqueous fluid having a pH less than 7.0 intermediate the exposing of the substrate to an aqueous fluid having a pH of greater than 7.0 and said depositing.

42. A method of forming a capacitor, comprising:
forming a polysilicon-comprising first capacitor electrode material over a substrate;
annealing the polysilicon with $PH_3$;
exposing the annealed polysilicon to an $NH_3$-comprising atmosphere and effective to form $Si_xO_yN_z$ on the first capacitor electrode material from polysilicon of the first capacitor electrode material;
exposing the $Si_xO_yN_z$ to an aqueous fluid comprising a base and an oxidizer, the aqueous fluid having a pH of at least 9.0;
after the exposing to the aqueous fluid, depositing an aluminum oxide-comprising capacitor dielectric material over the first capacitor electrode material; and
forming a metal-comprising second capacitor electrode material over the aluminum oxide-comprising capacitor dielectric material.

43. The method of claim 42 wherein at least a majority of the $NH_3$-comprising atmosphere is $NH_3$.

44. The method of claim 42 wherein the base comprises $NH_4OH$.

45. The method of claim 44 wherein $NH_4OH$ is present in the aqueous fluid at no greater than about 1.0% by weight.

46. The method of claim 44 wherein the base consists essentially of $NH_4OH$.

47. The method of claim 42 wherein the base comprises $(CH_3)_4NOH$.

48. The method of claim 42 wherein the base comprises an alkyl ammonium hydroxide.

49. The method of claim 42 wherein the aqueous solution is void of any alkyl ammonium hydroxide.

50. The method of claim 42 wherein the base comprises KOH.

51. The method of claim 42 wherein the base comprises $Al(OH)_3$.

52. The method of claim 42 wherein the base comprises $NH_4OH$ and the aqueous solution is void of any alkyl ammonium hydroxide.

53. The method of claim 52 wherein the base consists essentially of $NH_4OH$.

54. The method of claim 42 wherein the aqueous fluid has a pH of at least 11.0.

55. The method of claim 42 wherein the oxidizer comprises $H_2O_2$.

56. The method of claim 42 wherein the oxidizer comprises $O_3$.

57. The method of claim 42 wherein the oxidizer comprises ammonium persulfate.

58. The method of claim 42 wherein the base comprises $NH_4OH$ and the oxidizer comprises $H_2O_2$.

59. The method of claim 58 wherein $NH_4OH$ is present in the aqueous fluid at no greater than about 1.0% by weight, and $H_2O_2$ is present in the aqueous fluid at no greater than about 2.0% by weight.

60. The method of claim 58 wherein $NH_4OH$ is present in the aqueous fluid at from about 0.45% by weight to about 0.55% by weight, and $H_2O_2$ is present in the aqueous fluid at from about 0.5% by weight to about 1.5% by weight.

61. The method of claim 60 wherein the aqueous fluid consists essentially of water, $NH_4OH$, and $H_2O_2$, and has a pH of at least 10.0.

62. The method of claim 42 wherein all capacitor dielectric material received intermediate the first capacitor electrode material and the second capacitor electrode material is void of hafnium oxide.

63. The method of claim 42 wherein the exposing to the aqueous fluid is effective to increase capacitance of the capacitor formed by the method than would otherwise occur under identical conditions but for the exposing to the aqueous fluid.

64. The method of claim 42 being void of any exposure of the substrate to an aqueous fluid having a pH less than 7.0 intermediate the exposing of the substrate to an aqueous fluid having a pH of greater than 7.0 and said depositing.

65. The method of claim 42 wherein the aluminum oxide-comprising dielectric is deposited on the $Si_xO_yN_z$.

66. A method of forming a capacitor, comprising:
forming a polysilicon-comprising first capacitor electrode material over a substrate;
annealing the polysilicon with $PH_3$;
exposing the annealed polysilicon to a nitrogen-comprising atmosphere and effective to form $Si_xO_yN_z$ on the first capacitor electrode material from polysilicon of the first capacitor electrode material;
exposing the $Si_xO_yN_z$ to an aqueous fluid comprising $NH_4OH$ and an oxidizer, the $NH_4OH$ being present in the aqueous fluid at no greater than about 1.0% by weight, the oxidizer being present in the aqueous fluid at no greater than about 2.0% by weight, the aqueous fluid having a pH of at least 9.0, said exposing to the aqueous fluid etching some and only some of said $Si_xO_yN_z$ from the substrate;
after the exposing to the aqueous fluid, depositing an aluminum oxide-comprising capacitor dielectric material on the $Si_xO_yN_z$; and
forming a metal-comprising second capacitor electrode material over the aluminum oxide-comprising capacitor dielectric material.

67. The method of claim 66 wherein at least a majority of the nitrogen-comprising atmosphere is $NH_3$.

68. The method of claim 66 wherein the nitrogen-comprising atmosphere comprises $N_2$ and $H_2$.

69. The method of claim 66 wherein the nitrogen-comprising atmosphere comprises $N_2$ and $H_2$ plasma.

70. The method of claim 66 wherein the aqueous solution is void of any alkyl ammonium hydroxide.

71. The method of claim 66 wherein the aqueous fluid has a pH of at least 11.0.

72. The method of claim 66 wherein the oxidizer comprises $H_2O_2$.

73. The method of claim 66 wherein the oxidizer comprises $O_3$.

74. The method of claim 66 wherein the oxidizer comprises ammonium persulfate.

75. The method of claim 66 wherein the base comprises $H_2O_2$, and the aqueous fluid consists essentially of water, $NH_4OH$, and $H_2O_2$, and has a pH of at least 10.0.

76. The method of claim 66 wherein the exposing to the aqueous fluid is effective to increase capacitance of the capacitor formed by the method than would otherwise occur under identical conditions but for the exposing to the aqueous fluid.

77. The method of claim 66 being void of any exposure of the substrate to an aqueous fluid having a pH less than 7.0 intermediate the exposing of the substrate to an aqueous fluid having a pH of greater than 7.0 and said depositing.

78. The method of claim 66 wherein all capacitor dielectric material received intermediate the first capacitor electrode material and the second capacitor electrode material is void of hafnium oxide.

* * * * *

UNITED STATES PATENT AND TRADEMARK OFFICE
CERTIFICATE OF CORRECTION

PATENT NO. : 7,122,422 B2
APPLICATION NO. : 10/895481
DATED : October 17, 2006
INVENTOR(S) : Garo J. Derderian et al.

It is certified that error appears in the above-identified patent and that said Letters Patent is hereby corrected as shown below:

Col. 2, line 1 –
  Replace "FIG. 2 is a is a view of the FIG. 1 substrate fragment at"
  With --FIG. 2 is a view of the FIG. 1 substrate fragment at--

Col. 2, line 3 –
  Replace "FIG. 3 is a is a view of the FIG. 2 substrate fragment at"
  With --FIG. 3 is a view of the FIG. 2 substrate fragment at--

Col. 2, line 5 –
  Replace "FIG. 4 is a is a view of the FIG. 3 substrate fragment at"
  With --FIG. 4 is a view of the FIG. 3 substrate fragment at--

Col. 2, line 7 –
  Replace "FIG. 5 is a is a view of the FIG. 4 substrate fragment at"
  With --FIG. 5 is a view of the FIG. 4 substrate fragment at--

Col. 2, line 19 –
  Replace "with reference with FIGS. 1-5. Aspects of the invention"
  With --with reference to FIGS. 1-5. Aspects of the invention--

Col. 4, line 3 –
  Replace "and $H_2O_2$ present in the aqueous fluid at no great than about"
  With --and $H_2O_2$ present in the aqueous fluid at no greater than about --

UNITED STATES PATENT AND TRADEMARK OFFICE
CERTIFICATE OF CORRECTION

PATENT NO. : 7,122,422 B2
APPLICATION NO. : 10/895481
DATED : October 17, 2006
INVENTOR(S) : Garo J. Derderian et al.

It is certified that error appears in the above-identified patent and that said Letters Patent is hereby corrected as shown below:

Col. 4, line 14 –
  Replace "exposing to the aqueous fluid is for form no greater than 15"
  With --exposing to the aqueous fluid is for no greater than 15--

Signed and Sealed this

Thirty-first Day of July, 2007

JON W. DUDAS
*Director of the United States Patent and Trademark Office*